United States Patent [19]

Irving

[11] 4,439,517
[45] Mar. 27, 1984

[54] PROCESS FOR THE FORMATION OF IMAGES WITH EPOXIDE RESIN

[75] Inventor: Edward Irving, Burwell, England

[73] Assignee: Ciba-Geigy Corporation, Ardsley, N.Y.

[21] Appl. No.: 457,107

[22] Filed: Jan. 10, 1983

[30] Foreign Application Priority Data

Jan. 21, 1982 [GB] United Kingdom ............. 8201726

[51] Int. Cl.$^3$ .................................................. G03C 1/68
[52] U.S. Cl. ............................... 430/328; 430/280; 430/330; 430/325; 430/913; 430/914; 430/921; 430/919; 430/925
[58] Field of Search .......... 430/280, 330, 325, 913, 430/914, 921, 919, 922, 925, 328

[56] References Cited

U.S. PATENT DOCUMENTS

| | | | |
|---|---|---|---|
| 3,074,869 | 1/1963 | Workman | 204/158 |
| 3,691,133 | 9/1972 | Sura | 260/47 EC |
| 3,692,560 | 9/1972 | Rosenkranz et al. | |
| 3,709,861 | 1/1973 | Anderson | 204/159.11 X |
| 3,726,679 | 4/1973 | Abolafia et al. | 96/48 HD |
| 3,732,273 | 5/1973 | Heine et al. | 260/456 R |
| 4,035,189 | 7/1977 | Hayashi et al. | 96/115 R |
| 4,218,279 | 8/1980 | Green | 204/159.18 X |
| 4,220,707 | 9/1980 | Ohmura et al. | 430/325 |
| 4,252,592 | 2/1981 | Green | 204/159.11 X |
| 4,258,121 | 3/1981 | Kojima | 430/281 |
| 4,339,567 | 7/1982 | Green et al. | 204/159.11 X |

FOREIGN PATENT DOCUMENTS

| | | |
|---|---|---|
| 37152 | 10/1981 | European Pat. Off. |
| 44274 | 1/1982 | European Pat. Off. |
| 733409 | 7/1955 | United Kingdom |
| 1220702 | 1/1971 | United Kingdom |
| 1330100 | 9/1973 | United Kingdom |
| 1508951 | 4/1978 | United Kingdom |
| 1526923 | 10/1978 | United Kingdom |
| 1539192 | 1/1979 | United Kingdom |

OTHER PUBLICATIONS

S. P. Pappas et al., J. Radiation Curing, 7 (1), 2 (1980).

*Primary Examiner*—John E. Kittle
*Assistant Examiner*—Cynthia Hamilton
*Attorney, Agent, or Firm*—Luther A. R. Hall

[57] ABSTRACT

A layer of a photoresist composition on a substrate is exposed imagewise to actinic radiation, as through a negative, the photoresist composition comprising an epoxide resin, a benzenoid polyamine, and an aromatic compound which liberates an acid on exposure to actinic radiation. The composition is then heated such that where the radiation has struck the composition local curing of the epoxide resin takes place, the liberated acid acting as accelerator in the curing by the benzenoid polyamine. In parts not struck by radiation the acid accelerator is not liberated and so curing (and insolubilization of the epoxide resin in solvents) takes place much more slowly. By treatment with a suitable solvent unirradiated (and hence uncured) portions of the compositions are dissolved away, an image being formed on the substrate.

14 Claims, No Drawings

PROCESS FOR THE FORMATION OF IMAGES WITH EPOXIDE RESIN

BACKGROUND OF THE INVENTION

This invention relates to a process for the formation of images using photopolymerisable compositions and to substrates bearing an image prepared by this process.

The preparation of images by photopolymerisation is well known. A photopolymerisable composition is applied as a coating to a substrate, which is often a resinous laminate bearing a metal on its surface. The coating is exposed to actinic radiation through a negative or other mask, and unexposed (and hence unpolymerised) portions of the coating are removed by means of a suitable solvent. The substrate may then be etched, removing only those parts of the metal surface which do not bear the photopolymerised coating. Such image-forming processes are useful, for example, in the manufacture of printing plates and printed circuits. Photopolymerisable compositions frequently contain an epoxide resin as a polymerisable component.

Benzenoid polyamines, i.e., compounds containing more than two hydrogen atoms attached to nitrogen atoms which in turn are directly attached to carbon atoms in benzenoid rings, are often employed for the curing of epoxide resins. It is customary to employ acidic accelerators such as salicylic acid or 2-methoxyethyl hydrogen maleate to reduce the time required to heat the epoxide resin with the benzenoid polyamine for curing; however, even at room temperature some reaction between the epoxide resin and the polyamine occurs when an acid is present and so acceleration is achieved at the cost of a shorter storage life for the curable composition.

It has now been found that an acid may be generated in a mixture of an epoxide resin and a benzenoid polyamine by incorporating certain substances and, when desired, exposing the mixture to actinic radiation. Since these substances, in the absence of such radiation, do not behave as acids, the mixtures have adequate storage lives. The irradiated mixtures may then be heated to bring about curing rapidly. It has been further found that the accelerating effect may be confined to parts of the mixture which have been struck by radiation; the parts which have not been so struck cure much less rapidly and so differential curing can be achieved by employing a heating step of suitable duration. Surprisingly, the accelerating effect in a layer of the mixture can be very closely restricted to areas which have been irradiated, that is to say, the liberated acid does not substantially diffuse into adjacent, unirradiated areas, and so by exposure to actinic radiation as through a negative it is possible to form sharp images by subsequently dissolving or washing away the uncured, unexposed areas of the mixture with a suitable solvent, the cured, exposed areas withstanding the effect of the solvent.

In our British Patent Specification No. 1,508,951 we have described a method for the preparation of prepregs, i.e., fibre-reinforced, heat-curable resinous composites, which method comprises (i) impregnating a fibrous reinforcing material with a liquid composition containing an epoxide resin and a photopolymerisation catalyst therefor, and with a thermally-activated crosslinking agent for epoxide resin, and (ii) exposing the impregnated material to actinic radiation such that the composition solidifies due to photopolymerisation of the epoxide resin through epoxide groups thereof but which resin remains substantially in the thermosettable state.

When desired, the prepreg is heated so as to bring about the curing of the resin.

Photopolymerisation catalysts which may be employed in that process for making prepregs include aromatic onium salts which liberate an acid on exposure to actinic radiation, especially diazonium, arsonium, phosphonium, sulphonium, selenonium, and iodononium complex salts, particularly the tetrafluoroborates and hexafluorophosphates. The thermally-activated crosslinking agent may be a benzenoid polyamine such as bis(4-aminophenyl)methane.

In our related British Pat. No. 1,587,536 we have described a similar process for making prepregs in which such a composition is exposed to actinic radiation before it is brought into contact with the fibres, viz.

(i) exposing to actinic radiation a layer of a liquid composition containing an epoxide resin as the sole photopolymerisable component and a heat-activated curing agent for epoxide resins until the said composition solidifies to form an essentially solid continuous film due to photopolymerisation of the epoxide resin through epoxide groups thereof but which epoxide resin remains substantially in the thermosettable state, and (ii) bringing together the film so formed and fibrous reinforcing material under conditions such that the said film flows about the fibres and the components of the said film and the fibres form a coherent structure.

The prepreg is then heated to cure the resin.

In a third British Patent Specification No. 1,587,159, we have described a process in which similar compositions are used: there is described a method for bonding two surfaces together which comprises (i) exposing to actinic radiation a layer of a liquid composition containing an epoxide resin as the sole photopolymerisable component and a heat-activated curing agent for epoxide resins until the said composition solidifies to form an essentially solid continuous film due to photopolymerisation of the epoxide resin through epoxide groups thereof but which epoxide resin remains substantially in the thermosettable state, and (ii) sandwiching between, and in contact with, the two surfaces the film so formed and heating the assembly to cure the resin.

That an acid could be liberated by photolytic means to accelerate in situ the curing of an epoxide resin by an aromatic polyamine, and so provide the basis for a process for forming images, is unexpected. In British Patent Specification No. 1,330,100 there is described a process for preparing printed circuits including the steps of coating a support with a composition comprising an epoxide resin of epoxide requivalent weight 800 to 2000, an amine curing agent (which may be a benzenoid polyamine), a halogenated polycarboxylic acid anhydride, and a halogenated hydrocarbon solvent, exposing the coating to ultraviolet radiation in a predetermined pattern, heating the coating to cause hardening of the unexposed areas, and developing the coating to remove the exposed areas of the coating.

It will be immediately apparent that the process described in the aforementioned Specification No. 1 330 100 is for making positive images, whereas this invention provides a process for making negative resists. It is explained in Specification No. 1 330 100 that the chlorendic anhydride, i.e., 1,2,3,4,7,7-hexachlorobicyclo[2.2.1]hept-5-ene-2,3-dicarboxylic acid anhydride-the only halogenated polycarboxylic acid anhydride the use of which is illustrated—is believed to interfere with the thermal cure in the areas exposed to ultraviolet radiation. That patentee conjectured that, upon photolysis, chlorendic anhydride may release small amounts of hydrogen chloride which may form a salt with the amine curing agent, this salt being less reactive towards thermal cure, thus resulting in a differential solubility between the exposed and unexposed areas. The alternative explanation which was put forward is that reaction of the epoxide groups in the epoxide resin with hydrogen chloride or chlorendic anhydride occurs in the photolysed areas, slowing the rate of thermal cure.

Thus, the acceleration of cure taking place in irradiated areas, an essential feature of the present invention, when certain compounds are used, including those which are believed to form hydrogen chloride or other acids, is contrary to what would have been predicted from the disclosures of the above-mentioned British Patent Specification No. 1,330,100.

SUMMARY OF THE INVENTION

This invention accordingly provides a process for the formation of an image on a substrate which comprises (1) exposing imagewise to actinic radiation a layer of a photoresist composition on the substrate, the photoresist composition comprising
  (A) an epoxide resin and
  (B) an effective amount of
    (i) a benzenoid polyamine
    (ii) an aromatic compound which liberates an acid on exposure to actinic radiation, selected from
      (a) chlorides, bromides, and iodides of onium bases of elements in Group VA, VIA, or VIIA of the Periodic Table,
      (b) N-sulphonyloxyimides, and esters of sulphonic acids with β-hydroxypropiophenones or with o-hydroxyacylphenones,
      (c) o-nitrobenzaldehydes, and
      (d) α-chloroacylphenones and α-bromoacylphenones, (2) heating the composition on the substrate such that the part or parts of the composition which have been struck by the radiation are substantially cured whereas the part or parts thereof which have not been so struck remain substantially uncured, and then (3) treating the composition on the substrate with a solvent developer to remove the part or parts of the composition which remain substantially uncured.

("Aromatic" and its forms such as "arylene" in this Specification and the claims thereof are used in their more general sense to refer not only to benzenoid nuclei but to any nuclei having 2+4n π-electrons, e.g., pyridyl nuclei.)

DETAILED DISCLOSURE

Preferred epoxide resins for use as component (A) are those containing at least one group of formula

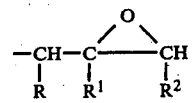

directly attached to an atom of oxygen, where either R and $R^2$ each represents a hydrogen atom, in which case $R^1$ denotes a hydrogen atom or a methyl group, or R and $R^2$ together represent —$CH_2CH_2$—, in which case $R^1$ denotes a hydrogen atom.

As examples of such resins may be mentioned polyglycidyl and poly(β-methylglycidyl) esters obtainable by reaction of a compound containing two or more carboxylic acid groups per molecule with epichlorohydrin, glycerol dichlorohydrin, or β-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid; and from aromatic polycarboxylic acids such as phthalic acid, isophthalic acid, and terephthalic acid. Other suitable polyglycidyl esters are obtainable by vinyl polymerisation of glycidyl esters of vinylic acids, especially glycidyl acrylate and glycidyl methacrylate.

Further examples are polyglycidyl and poly(β-methylglycidyl)ethers obtainable by reaction of a compound containing at least two free alcoholic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene)glycols, propane-1,2-diol and poly(oxypropylene)glycols, propane-1,3-diol, poly(oxytetramethylene)glycols, pentane-1,5-diol, hexane-2,4,6-triol, glycerol, 1,1,1-trimethylolpropane, pentaerythritol, sorbitol, and polyepichlorohydrins; from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane, 4,4'-dihydroxydiphenyl, bis(4-hydroxyphenyl)sulphone, 1,1,2,2-tetrakis(4-hydroxyphenyl)ethane, 2,2-bis(4-hydroxyphenyl)propane, 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.butylphenol.

Examples of epoxide resins having at least one group of formula I where R and $R^2$ conjointly denote a —$CH_2CH_2$— group are bis(2,3-epoxycyclopentyl)ether, 2,3-epoxycyclopentyl glycidyl ether, and 1,2-bis(2,3-epoxycyclopentyloxy)ethane.

Epoxide resins having the 1,2-epoxide groups attached to different kinds of oxygen atoms may be employed, e.g., the glycidyl ether-glycidyl ester of salicylic acid.

Epoxide resins in which some or all of the epoxide groups are not terminal may also be employed, such as vinylcyclohexane dioxide, limonene dioxide, dicyclopentadiene dioxide, 4-oxatetracyclo[6.2.1.0$^{2,7}$.0$^{3,5}$]undec-9-yl glycidyl ether, 1,2-bis(4-oxatetracyclo[6.2.1.0$^{2,7}$.0$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexyl)-8,9-epoxy-2,4-dioxaspiro[5,5]undecane, and epoxidised butadienes or copolymers of butadienes with ethylenic compounds such as styrene and vinyl acetate.

If desired, a mixture of epoxide resins may be used.

Especially preferred epoxide resins used in this invention are polyglycidyl ethers, which may have been advanced, of dihydric, trihydric, or tetrahydric phenols, e.g., 2,2-bis(4-hydroxyphenyl)-propane, bis(4-hydroxyphenyl)methane, and 1,1,2,2-tetrakis(4-hydroxyphenyl)ethane, and of dihydric or trihydric aliphatic alcohols, e.g., butane-1,4-diol and hexane-2,4,6-triol.

Benzenoid polyamines suitable for use as the heat-curing agent (i) in component (B) include o-, m-, and p-phenylenediamine, bis(4-aminophenyl)methane, aniline-formaldehyde resins, bis(4-aminophenyl)ether, bis(4-aminophenyl)ketone, bis(4-aminophenyl)sulphide, bis(3-aminophenyl)sulphone, and bis(4-aminophenyl)sulphone.

The source (ii) of the acid which is liberated photolytically may be, as already indicated, a chloride, bromide, or iodide of an onium base of the non-metallic elements of the A sub groups in Group V, VI, and VII of the Periodic Table (as shown on pages 60–61 in Handbook of Chemistry, Lange, Revised Tenth Edition, published by McGraw-Hill), in particular diazonium, phosphonium, arsonium, oxonium, sulphonium, sulphoxonium, selenonium, telluronium, chloronium, bromonium, and iodonium chlorides, bromides, or iodides.

Iodonium salts which may be used include those of formula $$[Ar^1—I^+—Ar^2]X^- \qquad II$$

where

Ar$^1$ and Ar$^2$ independently represent phenyl or naphthyl, which may be substituted by one or more alkyl groups of 1 to 8 carbon atoms, by phenyl, by phenoxy, by halogen, by nitro, or by one or more alkoxy groups each of 1 to 4 carbon atoms, or Ar$^1$ and Ar$^2$ together represent a group of formula

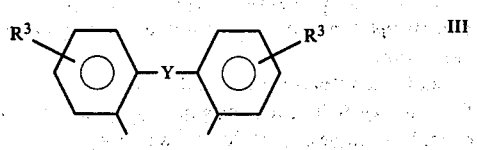

III wherein

R$^3$ denotes an alkyl group of 1 to 4 carbon atoms, a halogen atom, a nitro group, or an alkoxy group of 1 to 4 carbon atoms, Y denotes a carbon-carbon bond, an oxygen atom, or a group of formula —CH$_2$— or —CO—, and X$^-$ denotes a chloride, bromide, or iodide anion.

Iodonium salts of formula II and their use in the photopolymerisation of cationically-polymerisable materials are described in British Patent Specification No. 1,539,192.

Specific examples of suitable iodonium salts of formula II include diphenyliodonium chloride, diphenyliodonium iodide, di(p-tolyl)iodonium chloride, di(4-nitrophenyl)iodonium chloride, di(4-tert.butylphenyl)iodonium chloride, di-2-naphthyliodonium bromide, di(3-methoxyphenyl)iodonium chloride, diphenyl-2,2'-diyliodonium chloride, diphenylmethane-2,2'-diyliodonium chloride, and di(4-chlorophenyl oxide)-2,2'-diyliodonium chloride.

Sulphonium salts which may be used include those of the formula $$Ar^3{}_aR^4{}_bR^5{}_cS^+X^- \qquad IV$$

where

Ar$^3$ denotes a monovalent aromatic group of 6 to 20 carbon atoms,

R$^4$ denotes an alkyl group of 1 to 6 carbon atoms or a cycloalkyl group of 3 to 6 carbon atoms, which alkyl or cycloalkyl group may be substituted by an alkoxy group of 1 to 4 carbon atoms or by an alkoxycarbonyl group of 2 to 5 carbon atoms, R$^5$ denotes a polyvalent aliphatic or aromatic radical of 3 to 6 carbon atoms forming a heterocyclic or fused ring structure, a denotes 0, 1, 2, or 3, b denotes 0, 1, or 2, c denotes 0 or 1, the sum of (a+b+c) being 3 or the valency of the sulphur atom, and X$^-$ has the meaning assigned above.

Sulphonium salts of formula IV and their use in the photopolymerisation of materials which can be polymerised or cured with acids are described in British Patent Specification No. 1,526,923.

Specific examples of suitable sulphonium salts of formula IV include triphenylsulphonium bromide, triphenylsulphonium chloride, triphenylsulphonium iodide, diphenylethylsulphonium chloride, phenacyldimethylsulphonium chloride, phenacyltetrahydrothiophenium chloride, p-nitrophenacyltetrahydrothiophenium chloride, and 4-hydroxy-2-methylphenylhexahydrothiopyrilium chloride.

Sulphoxonium salts which may be used include the aryl and aracyl sulphoxonium salts of formula

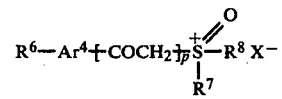

V where p denotes zero or 1,

Ar$^4$ denotes an arylene or aralkylene group of 4 to 25 carbon atoms linked directly through a carbon atom thereof, if p denotes zero, to the indicated sulphur atom or, if p denotes 1, to the indicated carbonyl carbon atom, R$^6$ denotes a hydrogen atom or a group of formula

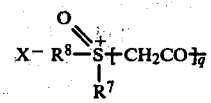

VI

R$^7$ denotes an alkyl group of 1 to 18 carbon atoms, an alkenyl group of 2 to 6 carbon atoms, a cycloalkyl group of 3 to 4 carbon atoms, a cycloalkylalkyl group of 4 to 8 carbon atoms, an aryl group of 4 to 24 carbon atoms, or an aralkyl group of 5 to 16 carbon atoms, $R^8$ has the same meaning as $R^7$ but may alternatively represent a dialkylamino group of 2 to 6 carbon atoms or, if $R^7$ denotes a said alkyl group, it may alternatively represent an arylamino group of 4 to 8 carbon atoms, q denotes zero when p denotes zero, or zero or 1 when p denotes 1, and $X^-$ has the meaning previously assigned.

Sulphoxonium salts of formula V and methods for their preparation are described in European patent application No. 0 035 969, as is their use for converting, by means of photopolymerisation, cationically-polymerisable substances into materials of higher molecular weight.

Specific examples of suitable sulphoxonium salts of formula VI include dimethylphenylsulphoxonium chloride, dimethylphenacylsulphoxonium bromide, dimethylphenacylsulphoxonium chloride, diphenylphenacylsulphoxonium bromide, 1,4-bis(1-oxo-2-(dimethylsulphoxonium)ethyl)benzene dichloride, (dimethylamino)diphenylsulphoxonium chloride, and triphenylsulphoxonium chloride.

Further suitable sulphoxonium salts include the carbamoylsulphoxonium salts of formula

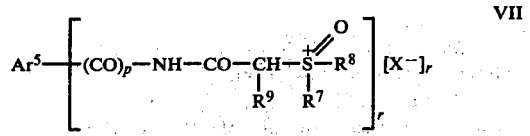

VII where p, $R^7$, $R^8$, and $R^9$ have the meanings assigned in formula V, r is 1 or 2, $Ar^5$ denotes an aromatic group of valency r, having from 4 to 25 carbon atoms and being directly linked through a carbon atom thereof to the carbon atom of the indicated adjacent carbonyl group if p is 1 or to indicated nitrogen atom if p is zero, $R^9$ denotes a hydrogen atom or a group of formula

 VIII or

 IX wherein $R^{11}$ denotes a monovalent saturated or ethylenically unsaturated radical of 1 to 12 carbon atoms, directly linked through a carbon atom thereof to the —CO— group shown in formula VIII, t is zero or 1, and $R^{12}$ denotes a monovalent saturated or ethylenically unsaturated radical of 1 to 12 carbon atoms, directly linked through a carbon atom thereof to, if t denotes zero, the indicated nitrogen atom, or, if t denotes 1, the carbon atom of the indicated adjacent carbonyl group.

Sulphoxonium salts of formula VII and methods for their preparation are described in European patent application No. 0 044 274, as is their use to convert, by means of photopolymerisation, cationically-polymerisable substances into materials of higher molecular weight.

Specific examples of suitable carbamoylsulphoxonium salts of formula VII include acetanilinodimethylsulphoxonium chloride and bromide, 3,4-dichloroacetanilinodimethylsulphoxonium chloride, p-methylacetanilinodimethylsulphoxonium chloride, benzoylcarbamoyldimethylsulphoxonium chloride, p-chloroacetanilinodimethylsulphoxonium chloride, and 2,4-bis(dimethylsulphoxoniummethylcarbamoyl)toluene dichloride.

Other aromatic compounds suitable as (ii) i.e., the source of an acid, include substances which generate sulphonic acids on photolysis, namely N-sulphonyloxyimides and esters of sulphonic acids with β-hydroxypropiophenones or with o-hydroxyacylphenones.

Suitable N-sulphonyloxyimides include those of formula

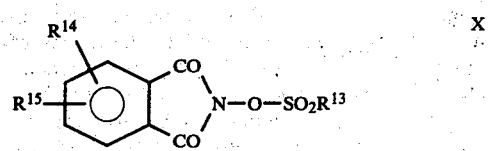 X or of formula

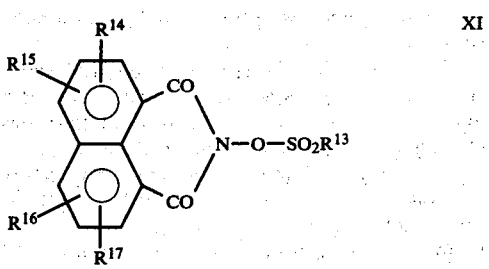 XI where $R^{13}$ denotes an alkyl group of 1 to 12 carbon atoms; a phenyl group which may be substituted by an alkyl group of 1 to 12 carbon atoms, an alkoxy group of 1 to 4 carbon atoms, a halogen atom, a nitro group, an alkylcarbamoyl group of 2 to 5 carbon atoms in all, or by a phenylcarbamoyl group; a naphthyl group which may be substituted by an alkyl group of 1 to 12 carbon atoms or by a halogen atom; a cycloalkyl group of 5 to 7 carbon atoms; or a group of formula —$CF_3$, —$CCl_3$, or —$CH_2Cl$, and $R^{14}$ to $R^{17}$ each independently represent hydrogen, an alkyl group of 1 to 8 carbon atoms, an alkoxy group of 1 to 4 carbon atoms, an alkylthio group of 1 to 12 carbon atoms, a phenylthio group, a nitro group, or a halogen atom.

Such N-sulphonyloxyimides are described in U.S. Pat. No. 4,258,121 for the photopolymerisation of compounds containing at least two ethylenically unsaturated groups.

Specific examples of suitable N-sulphonyloxyimides of formula X or XI include N-(phenylsulphonyloxy)phthalimide, N-(toluene-p-sulphonyloxy)phthalimide, N-(phenylsulphonyloxy)-1,8-naphthalimide, N-(naphthalene-1-sulphonyloxy)phthalimide, and N-(methylsulphonyloxy)phthalimide.

Suitable esters of sulphonic acids with β-hydroxypropiophenones include those of formula

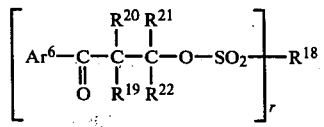

XII where r has the meaning assigned above, $Ar^6$ denotes an aromatic group of 6 to 14 carbon atoms which may be substituted by one or more alkyl or alkoxy groups of 1 to 8 carbon atoms, by one or more halogen atoms, or by a dialkylamino group in which the alkyl groups have from 1 to 4 carbon atoms and which may be substituted by a hydroxyl group, when $r=1$, $R^{18}$ denotes an alkyl group of 1 to 18 carbon atoms, an alkenyl group of 2 to 18 carbon atoms, a cycloalkyl or cycloalkenyl group of 5 to 8 carbon atoms, an aryl group of 6 to 12 carbon atoms (which may be substituted by a chlorine atom, a hydroxy group, an alkyl group of 1 to 12 carbon atoms, or by an alkoxy group of 1 to 4 carbon atoms), a cycloalkyl group of 5 to 6 carbon atoms, an aralkyl group of 7 to 9 carbon atoms, trifluoromethyl, fluoro, or an amino group, when $r=2$, $R^{18}$ denotes a group $—(CH_2)_n—$ in which n is an integer of from 2 to 8, a phenylene group or aralkylene group, either of which may be substituted by an alkyl or alkylene group of from 1 to 12 carbon atoms, $R^{19}$ denotes a hydrogen atom, an alkyl group of from 1 to 18 carbon atoms, an alkenyl group of from 2 to 18 carbon atoms, a trimethylsilyl group, an acetyl group, a cycloalkyl or cycloalkenyl group of from 5 to 8 carbon atoms, an aryl group of from 6 to 20 carbon atoms, a furfuryl group, or a group $—CH(R^{23})OR^{24}$ in which $R^{23}$ denotes a methyl group and $R^{24}$ denotes an alkyl group of 2 to 4 carbon atoms, or $R^{23}$ and $R^{24}$ together represent a 1,3- or 1,4-alkylene group having 3 or 4 carbon atoms and which may be substituted by an alkoxy group of 1 to 4 carbon atoms, $R^{20}$ represents a hydrogen atom, an aromatic group of 6 to 14 carbon atoms optionally substituted by one or more alkyl or alkoxy groups of 1 to 4 carbon atoms or by one or more halogen atoms, or an alkyl group of 1 to 8 carbon atoms which may be substituted by a phenyl group, $R^{21}$ and $R^{22}$ may each, independently, represent a hydrogen atom, an alkyl group of 1 to 8 carbon atoms, or a phenyl group which may be substituted by a chlorine atom, a hydroxy group, or an alkyl or alkoxy group of 1 to 4 carbon atoms, or $R^{20}$ and $R^{21}$, together with the carbon atoms to which they are attached, form a 5- or 6-membered carbocyclic ring.

Particularly preferred compounds of formula XII are sulphonic esters of α-methylolbenzoins having the general formula

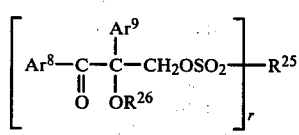

XIII where r has the meaning assigned above, $Ar^8$ and $Ar^9$ may be the same or different and each denote an aromatic group of 6 to 14 carbon atoms which may be substituted by one or more alkyl groups of 1 to 4 carbon atoms, by one or more alkoxy groups of 1 to 4 carbon atoms, or by one or more halogen atoms, $R^{25}$ denotes an alkyl or alkylene group of 1 to 6 carbon atoms, an aryl group of 6 to 12 carbon atoms, or an aralkylene group of 6 to 15 carbon atoms, and $R^{26}$ denotes a hydrogen atom or an alkyl group of 1 to 4 carbon atoms.

Examples of suitable compounds of formula XII and XIII are α-hydroxymethylbenzoin methanesulphonate, benzenesulphonate, toluene-p-sulphonate, and naphthalene-2-sulphonate, α-hydroxymethyl-4,4'-dimethylbenzoin benzenesulphonate, α-hydroxymethylbenzoin isopropyl ether benzenesulphonate, and 3-(p-toluenesulphonyloxy)-2-hydroxy-2-methyl-1-phenyl-1-propanone. Many of these compounds are described in U.S. Pat. No. 3,732,273 and in European patent application No. 0 037 152. Those that are not described in either of these publications may be prepared by reaction of an epoxide of formula XIV with a sulphonic or disulphonic acid of formula XV or XVI

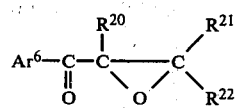

XIV

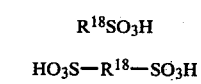

XV

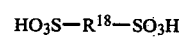

XVI where $Ar^6$, $R^{18}$, $R^{20}$, $R^{21}$, and $R^{22}$ are as hereinbefore defined. This reaction gives a product of formula XII in which $R^{19}$ represents a hydrogen atom. Such a product may be converted into another product of formula XII in which $R^{19}$ is other than a hydrogen atom by known methods of alkylation, etc.

Other suitable esters of sulphonic acids include those of o-hydroxyacylphenones, having the general formula

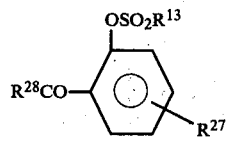

XVII where $R^{13}$ has the meaning assigned in formulae X and XI, $R^{27}$ denotes a hydrogen atom, a halogen atom, a nitro group, an alkyl group of 1 to 12 carbon atoms, an alkoxy group of 1 to 4 carbon atoms, or a group of formula $—OSO_2R^{13}$, and $R^{28}$ denotes an alkyl group of 1 to 4 carbon atoms, a phenyl group, or a group of formula

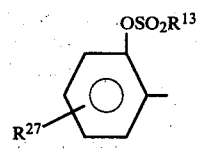

XVIII

Specific examples of compounds of formula XVII include 2-hydroxybenzophenone methanesulphonate and 2,4-dihydroxybenzophenone bis(methanesulphonate).

The preparation and use of such compounds in cationic polymerisation is described by Pappas and Chiu-Wing Lam, J. Radiation Curing 1980, 7 (1), 2–5.

o-Nitrobenzaldehydes may, as already stated, also be employed as (ii). These undergo rearrangement on irradiation with actinic energy to form o-nitrosobenzoic acids (see, e.g., British Patent Specification No. 733409). Suitable o-nitrobenzaldehydes include those of formula

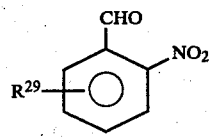

XIX where $R^{29}$ denotes a hydrogen atom or a nitro group, especially o-nitrobenzaldehyde and 2,6-dinitrobenzaldehyde.

The fourth group of aromatic compounds suitable for use as the source of an acid are α-chloroacylphenones and α-bromoacylphenones.

Preferred such α-haloacylphenones include those of formula

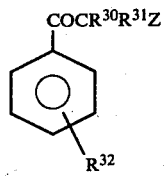

XX where
  Z represents a chlorine or bromine atom,
  $R^{30}$ and $R^{31}$ each independently represent a hydrogen, chlorine, or bromine atom, and
  $R^{32}$ denotes a hydrogen atom, an alkyl group of 1 to 6 carbon atoms, or a group of formula

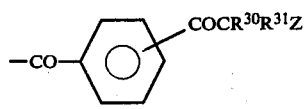

XXI

Suitable compounds of formula XX include α,α,α-trichloroacetophenone and p-tert.butyl-α,α,α-trichloroacetophenone, which are commercially employed as photopolymerisation catalysts.

Usually the composition will contain sufficient of the benzenoid polyamine (i) to supply from 0.7 to 1.1 aromatic amino hydrogen atoms per 1,2-epoxide group in the epoxide resin (A). The amount of the aromatic compound (ii) serving as a source of an acid depends on the efficacy of the photolytic process, the constitution of the compound, and on the amount of actinic energy to which that aromatic compound is exposed. Suitable proportions may readily be determined by routine experiments, but typically from 5 to 30%, preferably from 7 to 25%, by weight is used, calculated on the weight of the epoxide resin (A).

In the irradiating step actinic radiation of wavelength from 200 to 600 nm is preferably used. Suitable sources of radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual polymerisable substrate used, the type of light source, and its distance from the irradiated material.

To heat-cure the compositions they are preferably heated at from 100° C. to 140° C. for from 2 to 25 minutes, usually from 5 to 15 minutes.

The compositions may be applied to a substrate such as steel, aluminium, copper, cadmium, zinc, paper, or wood, preferably as a liquid, and irradiated and then heated. By exposing part or parts of the coating to irradiation through a mask and then heating, those sections which have not been cured may be dissolved away with a solvent such as cyclohexanone, 2-ethoxyethanol, toluene, acetone, and mixtures thereof. Thus the compositions of this invention may be used in the production of printing plates and printed circuits. Methods of producing printing plates and printed circuits from photopolymerisable compositions are well known.

The following Examples illustrate the invention. Unless otherwise indicated, parts are by weight.

Epoxide Resin I denotes a bromine-containing solid epoxide resin made by advancing the diglycidyl ether of 2,2-bis(p-hydroxyphenyl)propane with 2,2-bis(3,5-dibromo-4-hydroxyphenyl)propane; its epoxide content is 2.1 equiv./kg.

Epoxide Resin II denotes a mixture containing the tetraglycidyl ether of 1,1,2,2-tetrakis(p-hydroxyphenyl)ethane and the diglycidyl ether of 2,2-bis(p-hydroxyphenyl)propane. It was prepared by condensation of glyoxal and phenol (4 mol) to form the tetraphenol, addition of 20% by weight of 2,2-bis(p-hydroxyphenyl)propane, calculated on the weight of the tetraphenol, and glycidylation with epichlorohydrin. It has an epoxide content of 5.0 equiv./kg.

Epoxide Resin III denotes a polyglycidyl ether of 2,2-bis(p-hydroxyphenyl)propane, having an epoxide content of 1.6 equiv./kg and a softening point (Duran) of 75° to 85° C.

Epoxide Resin IV denotes the diglycidyl ester of 2,2-bis(4-(2-carboxycyclohexylcarbonyloxy)cyclohexyl)propane, prepared as in British Patent Specification No. 1 220 702. It has an epoxide content of 3.0 equiv./kg.

Polyamine I denotes a commercially available liquid curing agent consisting essentially of bis(4-aminophenyl)methane; its amine content is 17 NH-equiv./kg.

Polyamine II denotes a commercially available liquid curing agent consisting essentially of bis(4-aminophenyl)methane with dibutyl phthalate: its amine content is 4.9 NH-equiv./kg.

EXAMPLE 1

A composition comprising 5 parts of Epoxide Resin I, 5 parts of Epoxide Resin II, 2 parts of Polyamine I, 1 part of α,α,α-trichloroacetophenone, and 10 parts of cyclohexanone was applied as a thin coating onto a copper laminate by spin-coating at 2,500 rev. per minute. The coating was irradiated through a negative held 1 mm above it with a medium pressure mercury lamp (30 w per cm) for 20 minutes. The laminate was then heated at 120° C. for 10 minutes and allowed to cool. Development with cyclohexanone gave a good negative image, showing that curing had taken place where the coating had been struck by the irradiation but that where the coating had been sheltered from exposure by dark areas in the negative the composition had not cured, it remaining soluble in the organic solvent.

For purposes of comparison the experiment was repeated, omitting Polyamine I. On development the coating entirely dissolved, no image being visible, thus confirming that insolubilisation, i.e., curing, depended on the presence of Polyamine I and was not due solely to the action of α,α,α-trichloroacetophenone.

The experiment was again carried out but this time omitting the α,α,α-trichloroacetophenone. On development a very faint image was discernible but nearly all of the coating dissolved, confirming that Polyamine I was practically ineffective under the conditions employed to bring about curing.

EXAMPLE 2

A composition comprising 10 parts of Epoxide Resin I, 5 parts of each of Epoxide Resin II and Epoxide Resin III, 4 parts of Polyamine II, 4 parts of o-nitrobenzaldehyde, and 20 parts of cyclohexanone was spin-coated onto a copper laminate as in Example 1 and then the coating was heated for 2 minutes at 50° C. to drive off remaining cyclohexanone. Next, the coating was irradiated for 20 minutes with a medium pressure mercury lamp (30 w per cm) through a negative held in contact with the coating, then it was heated at 120° C. for 15 minutes. On development with toluene a clear image was formed.

It is known that o-nitrobenzaldehyde on photolysis rearranges to o-nitrosobenzoic acid. The latter, being a monofunctional acid, cannot bring about the crosslinking (and insolubilisation) of epoxide resins. This demonstrates that the curing observed is due not to the direct effect of o-nitrobenzaldehyde or the acid generated from it in the exposed areas but to the combined effect of Polyamine II and the acid.

EXAMPLE 3

The procedure of Example 2 was repeated but with 8 parts of Polyamine II. A clear image was obtained on development with a 9:1 mixture (by volume) of toluene-acetone.

EXAMPLE 4

The process of Example 1 was repeated, using in place of α,α,α-trichloroacetophenone 1.8 parts of a 50% aqueous solution of triphenylsulphonium chloride. Development in toluene-acetone (9:1 by volume) gave an image.

For purposes of comparison the experiment was repeated but omitting Polyamine I. On development with toluene-acetone (9:1 by volume) a very faint image was seen, but the action of the triphenylsulphonium chloride in the absence of Polyamine I was quite insufficient for any useful effect to be obtained, and on development with cyclohexanone instead of toluene-acetone the coating dissolved completely.

EXAMPLE 5

The procedure of Example 1 was repeated, using 0.9 part of diphenyliodonium chloride in place of α,α,α-trichloroacetophenone, and 4 parts of Polyamine II in place of Polyamine I. A clear image was formed on development with cyclohexanone.

For purposes of comparison the experiment was repeated but omitting Polyamine I. On development with either toluene-acetone (9:1 by volume) or cyclohexanone the coating dissolved completely, no image being observed.

EXAMPLE 6

The procedure of Example 1 was followed, using a mixture comprising 5 parts of Epoxide Resin I, 5 parts of Epoxide Resin II, 4 parts of Polyamine II, and 1 part of N-(phenylsulphonyloxy)-1,8-naphthalimide in 10 parts of N-methylpyrrolidone; after irradiation the laminate was heated at 120° C. for only 5 minutes. Development in toluene-acetone (9:1 by volume) afforded an image that withstood etching in an etching fluid (a 41% aqueous solution of ferric chloride).

For purposes of comparison the experiment was repeated but omitting the N-(phenylsulphonyloxy)-1,8-naphthalimide and heating for 10 minutes. On development with toluene-acetone (9:1 by volume) only a faint outline of the image could be detected, despite the doubling of the curing time, and with cyclohexanone the coating dissolved completely.

EXAMPLE 7

The procedure of the first part of Example 6 was followed except that an equal weight of N-(phenylsulphonyloxy)phthalimide was used in place of the naphthalimide; a good image resulted on development with cyclohexanone.

EXAMPLE 8

The procedure of Example 2 was repeated, employing 5 parts of Epoxide Resin I, 5 parts of Epoxide Resin II, 2 parts of Polyamine II, 2 parts of benzophenone-2-methanesulphonate, and 10 parts of cyclohexanone. Development in toluene-acetone (9:1 by volume) gave an image which was, however, slightly distorted due to the coating flowing a small amount during heating.

EXAMPLE 9

A composition comprising 10 parts of Epoxide Resin IV, 2 parts of bis(4-aminophenyl) sulphone, 1 part of 3-(p-toluenesulphonyloxy)-2-hydroxy-2-methyl-1-phenyl-1-propanone, 5 parts of acetone, and 6 parts of cyclohexanone was applied as a thin coating onto a copper-clad laminate by spin-coating at 2000 rev. per minute for 1 minute. The coating was dried at 50° C. for 2 minutes, leaving a tack-free finish, then irradiated through a negative for 5 minutes using a 5000 w medium pressure metal halide lamp at a distance of 75 cm.

The irradiated plate was then heated for 10 minutes at 140° C., and allowed to cool. Development using a mixture of toluene and acetone (80:20 by volume) gave a negative image.

What is claimed is:

1. A process for the formation of an image on a substrate which comprises
    (1) exposing imagewise to actinic radiation a layer of a photoresist composition on the substrate, the photoresist composition comprising
        (A) an epoxide resin and
        (B) an effective amount, for curing, of
            (i) a benzenoid polyamine
            (ii) an aromatic compound which liberates an acid on exposure to actinic radiation, selected from
                (a) chlorides, bromides, and iodides of onium bases of elements in Group VA, VIA, or VIIA of the Periodic Table, (b) N-sulfonyloxyimides, and esters of sulfonic acids with β-hydroxypropiophenones or with o-hydroxyacylphenones, (c) o-nitrobenzaldehydes, and (d) α-chloroacylphenones and α-bromoacylphenones, (2) heating the composition on the substrate such that the part or parts of the composition which have been struck by the radiation are substantially cured whereas the part or parts thereof which have not been so struck remain substantially uncured, and then (3) treating the composition on the substrate with a solvent developer to remove the part or parts of the composition which remain substantially uncured.

2. The process of claim 1 in which the benzenoid polyamine (i) is o-, m-, or p-phenylenediamine, bis(4-aminophenyl)methane, an aniline-formaldehyde resin, bis(4-aminophenyl) ether, bis(4-aminophenyl) ketone, bis(4-aminophenyl) sulfide, bis(3-aminophenyl) sulphone, or bis(4-aminophenyl) sulfone.

3. The process of claim 1 in which the aromatic compound (ii) is a diazonium, phosphonium, arsonium, oxonium, sulfonium, sulfoxonium, selenonium, telluronium, chloronium, bromonium, or iodonium chloride, bromide, or iodide.

4. The process of claim 1 in which the aromatic compound (ii) is an iodonium salt of formula

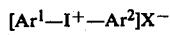   II where
Ar$^1$ and Ar$^2$ independently represent phenyl, naphthyl, phenyl containing in the ring at least one substituent chosen from alkyl groups of 1 to 8 carbon atoms, phenyl groups, phenoxy groups, halogen atoms, nitro groups, and alkoxy groups of 1 to 4 carbon atoms, naphthyl containing in a ring at least one substituent chosen from alkyl groups of 1 to 8 carbon atoms, phenyl groups, phenoxy groups, halogen atoms, nitro groups, and alkoxy groups of 1 to 4 carbon atoms, or
Ar$^1$ and Ar$^2$ together represent a group of formula

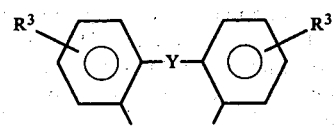   III wherein
R$^3$ denotes an alkyl group of 1 to 4 carbon atoms, a halogen atom, a nitro group, or an alkoxy group of 1 to 4 carbon atoms,
Y denotes a carbon-carbon bond, an oxygen atom, or a group of formula —CH$_2$— or —CO—, and
X$^-$ denotes a chloride, bromide, or iodide anion.

5. The process of claim 1 in which the aromatic compound
(ii) is a sulfonium salt of formula

   IV where
Ar$^3$ denotes a monovalent aromatic group of 6 to 20 carbon atoms,
R$^4$ denotes an alkyl group of 1 to 6 carbon atoms, a cycloalkyl group of 3 to 6 carbon atoms, an alkyl group of 1 to 6 carbon atoms substituted by an alkoxy group of 1 to 4 carbon atoms or by an alkoxycarbonyl group of 2 to 5 carbon atoms, or a cycloalkyl group substituted by an alkoxy group of 1 to 4 carbon atoms or by an alkoxycarbonyl group of 2 to 5 carbon atoms,
R$^5$ denotes a polyvalent aliphatic or aromatic radical of 3 to 6 carbon atoms forming a heterocyclic or fused ring structure,
a denotes 0, 1, 2, or 3,
b denotes 0, 1 or 2,
c denotes 0 or 1, the sum of (a+b+c) being 3 or the valence of the sulfur atom, and
X$^-$ denotes a chloride, bromide, or iodide anion.

6. The process of claim 1 in which the aromatic compound (ii) is a sulfoxonium salt of forming

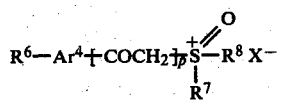   V or

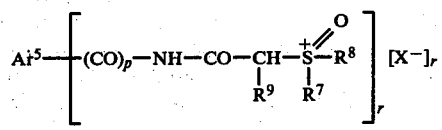   VII where
p denotes zero or 1,
Ar$^4$ denotes an arylene or aralkylene group of 4 to 25 carbon atoms linked directly through a carbon atom thereof, when p denotes zero, to the indicated sulfur atom or, when p denotes 1, to the indicated carbonyl carbon atom,
R$^6$ denotes a hydrogen atom or a group of formula

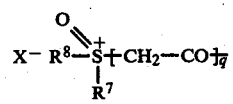   VI

R$^7$ denotes an alkyl group of 1 to 18 carbon atoms, an alkenyl group of 2 to 6 carbon atoms, a cycloalkyl group of 3 to 4 carbon atoms, a cycloalkylalkyl group of 4 to 8 carbon atoms, an aryl group of 4 to 24 carbon atoms, or an aralkyl group of 5 to 16 carbon atoms,
R$^8$ has the same meaning as R$^7$, or R$^8$ represents a dialkylamino group of 2 to 6 carbon atoms or, when R$^7$ denotes a said alkyl group, R$^8$ may also represent an arylamino group of 4 to 8 carbon atoms,
q denotes zero when p denotes zero, or zero or 1 when p denotes 1,
X$^-$ denotes a chloride, bromide, or iodide anion,
r is 1 or 2,
Ar$^5$ denotes an aromatic group of valency r, having from 4 to 25 carbon atoms and being directly linked through a carbon atom thereof to the carbon atom of the indicated adjacent carbonyl group when p is 1 or to the indicated nitrogen atom when p is zero,
R$^9$ denotes a hydrogen atom or a group of formula

—COR$^{11}$   VIII or

—CO—NH—(CO)$_t$—R$^{12}$　　　IX wherein
R$^{11}$ denotes a monovalent saturated or ethylenically unsaturated radical of 1 to 12 carbon atoms, directly linked through a carbon atom thereof to the —CO— group shown in formula VIII, t is zero or 1, and R$^{12}$ denotes a monovalent saturated or ethylenically unsaturated radical of 1 to 12 carbon atoms, directly linked through a carbon atom thereof to, when t denotes zero, the indicated nitrogen atom, or, when t denotes 1, the carbon atom of the indicated adjacent carbonyl group.

7. The process of claim 1 in which the aromatic compound (ii) is an N-sulfonyloxyimide of formula

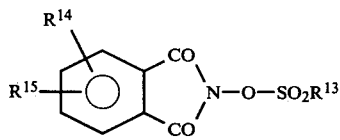　　　X or of formula

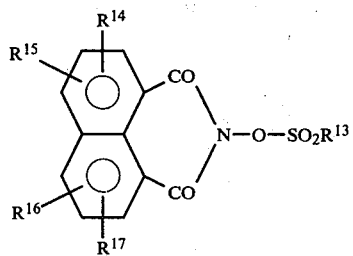　　　XI where
R$^{13}$ denotes an alkyl group of 1 to 12 carbon atoms; a phenyl group; a phenyl group substituted by an alkyl group of 1 to 12 carbon atoms, an alkoxy group of 1 to 4 carbon atoms, a halogen atom, a nitro group, an alkylcarbamoyl group of 2 to 5 carbon atoms in all, or by a phenylcarbamoyl group; a naphthyl group; a naphthyl group substituted by an alkyl group of 1 to 12 carbon atoms or by a halogen atom; a cycloalkyl group of 5 to 7 carbon atoms, or a group of formula —CF$_3$, —CCl$_3$, or —CH$_2$Cl, and R$^{14}$ to R$^{17}$ each independently represent a hydrogen, an alkyl group of 1 to 8 carbon atoms, an alkoxy group of 1 to 4 carbon atoms, an alkylthio group of 1 to 12 carbon atoms, a phenylthio group, a nitro group, or a halogen atom.

8. The process of claim 1 in which the aromatic compound (ii) is a sulfonic ester of a β-hydroxypropiophenone, having the general formula

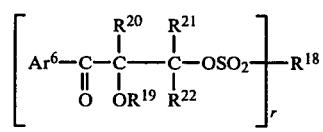　　　XII where
r is 1 or 2,

Ar$^6$ denotes an aromatic group of 6 to 14 carbon atoms or an aromatic group of 6 to 14 carbon atoms substituted by at least one alkyl or alkoxy group of 1 to 8 carbon atoms or by at least one halogen atom, or by a dialkylamino group in which the alkyl groups have from 1 to 4 carbon atoms, when r denotes 1, then R$^{18}$ denotes an alkyl group of 1 to 18 carbon atoms, an alkenyl group of 2 to 18 carbon atoms, a cycloalkyl or cycloalkenyl group of 5 to 8 carbon atoms, an aryl group of 6 to 12 carbon atoms, an aryl group of 6 to 12 carbon atoms substituted by a chlorine atom, a hydroxy group, an alkyl group of 1 to 12 carbon atoms, or by an alkoxy group of 1 to 4 carbon atoms, a cycloalkyl group of 5 or 6 carbon atoms, an aralkyl group of 7 to 9 carbon atoms, trifluoromethyl, fluoro, or an amino group, when r represents 2, then R$^{18}$ denotes a group —(CH$_2$)$_n$— in which n is an integer of from 2 to 8, a phenylene group, an aralkylene group, a phenylene group substituted by an alkyl or alkylene group of 1 to 12 carbon atoms, or an aralkylene group substituted by an alkyl or alkylene group of 1 to 12 carbon atons, R$^{19}$ denotes a hydrogen atom, an alkyl group of from 1 to 18 carbon atoms, an alkenyl group of 2 to 18 carbon atoms, a trimethylsilyl group, an acetyl group, a cycloalkyl or cycloalkenyl group of from 5 to 8 carbon atoms, an aryl group of from 6 to 20 carbon atoms, a furfuryl group, or a group —CH(R$^{23}$)OR$^{24}$ in which R$^{23}$ denotes a methyl group and R$^{24}$ denotes an alkyl group of from 2 to 4 carbon atoms or R$^{23}$ and R$^{24}$ together represent a 1,3- or 1,4-alkylene group having 3 to 4 carbon atoms or a 1,3- or 1,4-alkylene group having 3 or 4 carbon atoms and substituted by an alkoxy group of from 1 to 4 carbon atoms, R$^{20}$ represents a hydrogen atom, an aromatic group of 6 to 14 carbon atoms, an aromatic group of 6 to 14 carbon atoms substituted by at least one alkyl or alkoxy group of 1 to 4 carbon atoms or by at least one halogen atom, an alkyl group of 1 to 8 carbon atoms, or an alkyl group of 1 to 8 carbon atoms substituted by a phenyl group, R$^{21}$ and R$^{22}$ may each, independently, represent a hydrogen atom, an alkyl group of 1 to 8 carbon atoms, a phenyl group, or a phenyl group substituted by a chlorine atom, a hydroxy group, or by an alkyl or alkoxy group of 1 to 4 carbon atoms, or R$^{20}$ and R$^{21}$, together with the carbon atoms to which they are attached, form a 5- or 6-membered carbocyclic ring.

9. The process of claim 1 in which the aromatic compound (ii) is a sulfonic ester of an α-methylolbenzoin, having the general formula

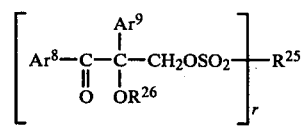　　　XIII where
r is 1 or 2,

Ar$^8$ and Ar$^9$ may be the same or different and each denotes an aromatic group of 6 to 14 carbon atoms, or an aromatic group of 6 to 14 carbon atoms substituted by at least substituent chosen from alkyl groups of 1 to 4 carbon atoms, alkoxy groups of 1 to 4 carbon atoms, and halogen atoms, $R^{25}$ denotes an alkyl or alkylene group of 1 to 6 carbon atoms, an aryl group of 6 to 12 carbon atoms, or an aralkylene group of 6 to 15 carbon atoms, and $R^{26}$ denotes a hydrogen atom or an alkyl group of 1 to 4 carbon atoms.

10. The process of claim 1 in which the aromatic compound (ii) is a sulfonic ester of an o-hydroxyacylophenone, having the general formula

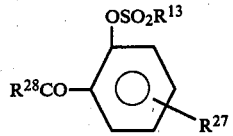   XVII $R^{13}$ denotes an alkyl group of 1 to 12 carbon atoms; a phenyl group; a phenyl group substituted by an alkyl group of 1 to 12 carbon atoms, an alkoxy group of 1 to 4 carbon atoms, a halogen atom, a nitro group, an alkylcarbamoyl group of 2 to 5 carbon atoms in all, or by a phenylcarbamoyl group; a naphthyl group; a naphthyl group substituted by an alkyl group of 1 to 12 carbon atoms or by a halogen atom; a cycloalkyl group of 5 to 7 carbon atoms, or a group of formula —$CF_3$, —$CCl_3$, or —$CH_2Cl$, $R^{27}$ denotes a hydrogen atom, a halogen atom, a nitro group, an alkyl group of 1 to 12 carbon atoms, an alkoxy group of 1 to 4 carbon atoms, or a group of formula —$OSO_2R^{13}$, and $R^{28}$ denotes an alkyl group of 1 to 4 carbon atoms, a phenyl group, or a group of formula

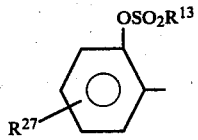   XVIII

11. The process of claim 1 in which the aromatic compound (ii) is an o-nitrobenzaldehyde of formula

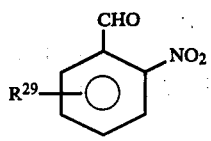   XIX where $R^{29}$ denotes a hydrogen atom or a nitro group.

12. The process of claim 1 in which the aromatic compound (ii) is an α-chloroacylphenone or an α-bromoacylphenone of formula

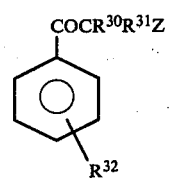   XX where
Z represents a chlorine or bromine atom,
$R^{30}$ and $R^{31}$ each independently represent a hydrogen, chlorine, or bromine atom, and
$R^{32}$ denotes a hydrogen atom, an alkyl group of 1 to 6 carbon atoms, or a group of formula

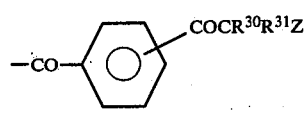   XXI

13. The process of claim 1 in which the photoresist composition contains sufficient of the benzenoid polyamine (i) to supply from 0.7 to 1.1 aromatic amino hydrogen atoms per 1,2-epoxide group in the epoxide resin (A).

14. The process of claim 1 in which the photoresist composition contains from 5 to 30% by weight, calculated on the weight of the epoxide resin (A), of the aromatic compound (ii).

* * * * *